(12) United States Patent
Ahn et al.

(10) Patent No.: US 12,424,439 B2
(45) Date of Patent: Sep. 23, 2025

(54) METHOD OF DEPOSITING ATOMIC LAYER AND METHOD OF MANUFACTURING SEMICONDUCTOR DEVICE

(71) Applicant: Samsung Electronics Co., Ltd., Suwon-si (KR)

(72) Inventors: Hyunjun Ahn, Suwon-si (KR); Hongtaek Lim, Suwon-si (KR); Kyoungwoo Hong, Suwon-si (KR); Hanhim Kang, Suwon-si (KR); Yeongyeop Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 394 days.

(21) Appl. No.: 18/176,692

(22) Filed: Mar. 1, 2023

(65) Prior Publication Data

US 2023/0420248 A1  Dec. 28, 2023

(30) Foreign Application Priority Data

Jun. 28, 2022 (KR) .................. 10-2022-0079263

(51) Int. Cl.
*H01L 21/02* (2006.01)
*H01L 21/285* (2006.01)
*H01L 21/3205* (2006.01)

(52) U.S. Cl.
CPC .... *H01L 21/0228* (2013.01); *H01L 21/02167* (2013.01); *H01L 21/0217* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02208* (2013.01); *H01L 21/28506* (2013.01); *H01L 21/32051* (2013.01)

(58) Field of Classification Search
None
See application file for complete search history.

(56) References Cited

U.S. PATENT DOCUMENTS

| | | | |
|---|---|---|---|
| 7,060,614 B2 | 6/2006 | Ishizuka et al. | |
| 7,118,779 B2 | 10/2006 | Verghese et al. | |
| 7,713,831 B2 | 5/2010 | Park et al. | |
| 7,713,874 B2 | 5/2010 | Milligan | |
| 9,441,291 B2 | 9/2016 | Kumagai et al. | |
| 10,229,826 B2 | 3/2019 | Tarafdar et al. | |
| 10,872,814 B2 | 12/2020 | Narushima et al. | |
| 2005/0069641 A1 | 3/2005 | Matsuda et al. | |
| 2017/0365483 A1* | 12/2017 | Chiu | H01L 21/02315 |
| 2019/0067095 A1 | 2/2019 | Zhu et al. | |

FOREIGN PATENT DOCUMENTS

KR  10-2021-0056910 A  5/2021

* cited by examiner

*Primary Examiner* — Asok K Sarkar
(74) *Attorney, Agent, or Firm* — Fish & Richardson P.C.

(57) ABSTRACT

A method of depositing an atomic layer of a metal-containing film including a plurality of deposition cycles is provided. Each of the plurality of deposition cycles may include adsorbing a hydrogen (H)-containing compound on a wafer surface in a chamber, treating a wafer on which the H-containing compound is adsorbed with hydrogen ($H_2$) gas, and providing a metal precursor to the wafer to react with the H-containing compound to form the metal-containing film.

20 Claims, 11 Drawing Sheets

METHOD OF DEPOSITING ATOMIC LAYER AND METHOD OF MANUFACTURING SEMICONDUCTOR DEVICE

CROSS-REFERENCE TO RELATED APPLICATION

This application is based on and claims priority under 35 U.S.C. § 119 to Korean Patent Application No. 10-2022-0079263, filed on Jun. 28, 2022, in the Korean Intellectual Property Office, the disclosure of which is incorporated by reference herein in its entirety.

BACKGROUND

The inventive concepts relate to methods of depositing an atomic layer and/or methods of manufacturing a semiconductor device.

Due to the advancement of industry and the demand for high-performance devices, the manufacturing process of a semiconductor device is becoming more severe and approaching the physical limit. In order to manufacture such a high-performance semiconductor device, the application of an atomic layer deposition process, which forms one atomic layer in one cycle is increasing.

In contrast to chemical vapor deposition, in atomic layer deposition, a precursor and a reactor are temporally separated and exposed to a wafer. That is, the precursor and the reactor are provided in sequential pulses that do not exist simultaneously, and evacuation and purging processes are required to remove a residual precursor and a reactor between the precursor and the reactor.

Recently, various methods for improving the properties of films formed by atomic layer deposition have been studied.

SUMMARY

The inventive concepts provide methods of depositing an atomic layer with improved reliability and/or methods of manufacturing a semiconductor device.

According to an example embodiment, a method of depositing an atomic layer of a metal-containing film may include a plurality of deposition cycles Each of the plurality of deposition cycles may include adsorbing a hydrogen (H)-containing compound on a wafer surface in a chamber, treating a wafer on which the H-containing compound is adsorbed with hydrogen ($H_2$) gas, and providing a metal precursor to the wafer to react with the H-containing compound to form the metal-containing film.

According to an example embodiment, a method of manufacturing a semiconductor device may include performing a plurality of deposition cycles to form a metal-containing film or a silicon-containing film. Each of the plurality of deposition cycles may include supplying a first gas including a hydrogen-containing compound to the chamber in which the wafer is loaded, supplying a second gas to the chamber, and supplying a third gas including a precursor including metal or silicon to the chamber, wherein the precursor reacts with the hydrogen-containing compound to form the metal-containing or silicon-containing film, and the second gas hydrogenates the hydrogen-containing compound.

According to an example embodiment, a method of atomic layer deposition of a metal-containing film may include depositing a nitrogen and hydrogen containing compound on a surface of a wafer, treating the hydrogen containing compound with hydrogen gas, and reacting the nitrogen and hydrogen containing compound treated by the hydrogen gas with a precursor including titanium to form a film on the surface of the wafer.

According to an example embodiment, a method of atomic layer deposition of a metal-containing film may include a plurality of deposition cycles. Each of the plurality of deposition cycles includes adsorbing a metal precursor onto a wafer surface in a chamber to deposit a monolayer of the metal precursor, treating the wafer on which the monolayer of the metal precursor is deposited with hydrogen ($H_2$) gas, and providing a hydrogen-containing compound to the wafer to form the metal-containing film by reaction of the monolayer of the metal precursor with the hydrogen-containing compound.

According to an example embodiment, a method of atomic layer deposition of a metal-containing film may include performing a plurality of deposition cycles. Each of the plurality of deposition cycles may include hydrogenating a wafer surface in a chamber by supplying hydrogen ($H_2$) gas to the chamber, adsorbing a metal precursor onto the wafer surface to deposit a monolayer of the metal precursor, and providing a reactant to the wafer such that the reactant reacts with the monolayer of the metal precursor to form the metal-containing film, wherein the reactant is a hydrogen-containing compound.

BRIEF DESCRIPTION OF THE DRAWINGS

Example embodiment of the inventive concepts will be more clearly understood from the following detailed description taken in conjunction with the accompanying drawings in which.

DETAILED DESCRIPTION

Figure 1:
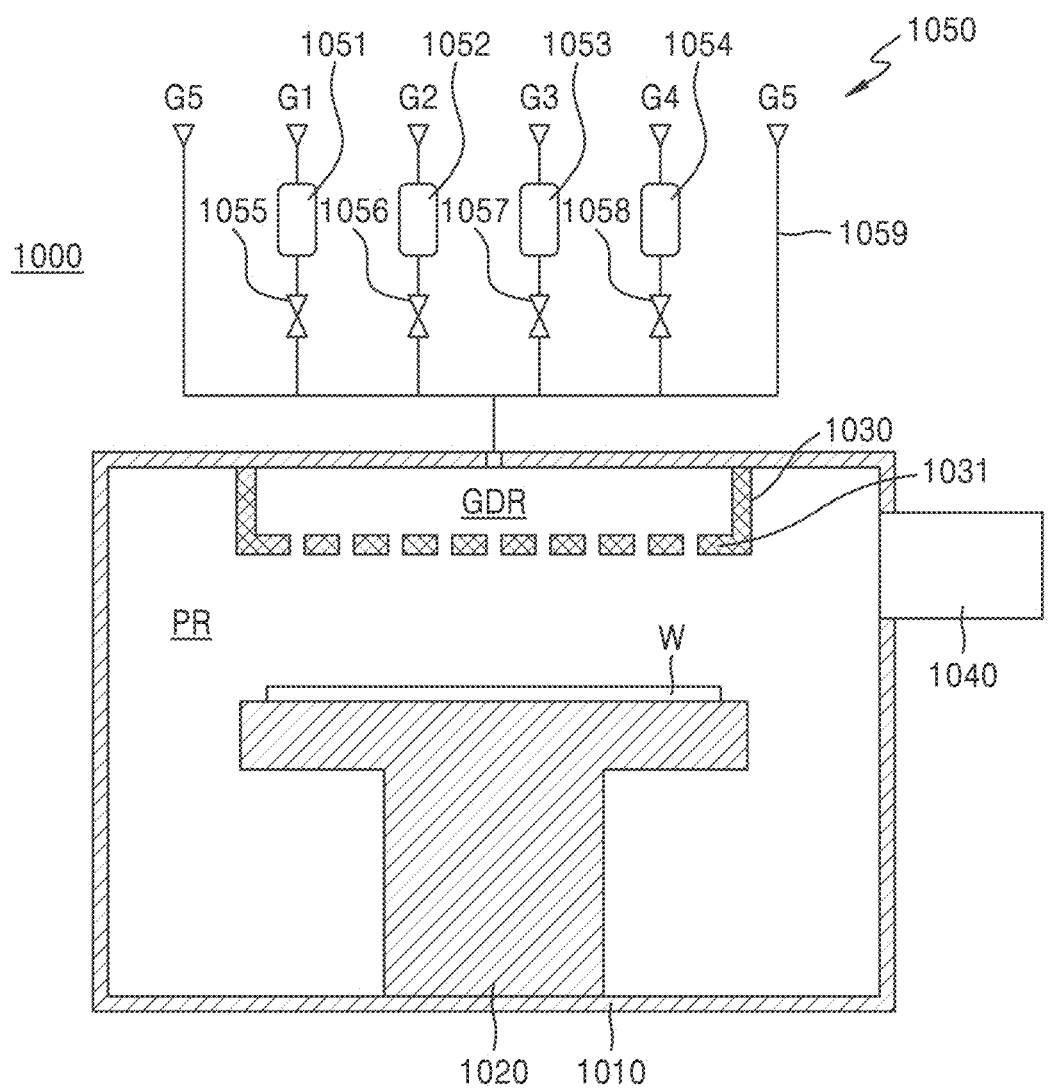
FIG. 1 is a diagram for describing a semiconductor device manufacturing apparatus according to an example embodiment.

Hereinafter, some example embodiments of the inventive concepts are described in detail with reference to the accompanying drawings. The same reference numerals are used for the same components in the drawings, and descriptions already given for the same components are omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, expressions such as "at least one of" and "any one of," when preceding a list of elements, modify the entire list of elements and do not modify the individual elements of the list. Thus, for example, both "at least one of A, B, or C" and "A, B, and C" mean either A, B, C or any combination thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

FIG. 1 is a diagram for describing a semiconductor device manufacturing apparatus 1000 according to an example embodiment.

Referring to FIG. 1, the semiconductor device manufacturing apparatus 1000 may include a chamber 1010, a stage 1020, a shower head 1030, an exhaust portion 1040, and a processing gas supply device 1050.

The semiconductor device manufacturing apparatus 1000 may be configured to perform a semiconductor device manufacturing process. According to some example embodiments, the semiconductor device manufacturing apparatus 1000 may be configured to perform deposition of a film. According to some example embodiments, the semiconductor device manufacturing apparatus 1000 may be configured to, for example, perform atomic layer deposition (ALD).

The ALD is a self-limiting surface treatment. In more detail, the ALD includes adsorbing a first reactant on a wafer S, and providing a second reactant to react with the first reactant. In this case, the first reactant adsorbed to the surface of the wafer (or the surface of the uppermost material layer formed on the wafer) is limited to one atomic layer, and the deposition of the first reactant is self-limiting. Because the second reactant is limited by the first reactant on the surface of the wafer S, the reaction between the first reactant and the second reactant is also self-limiting.

The ALD may be a cyclic process. The ALD may include a plurality of periodically repeated steps. One atomic layer may be formed on the wafer S in one ALD cycle. By repeating a plurality of ALD cycles, a film having a target thickness may be formed on the wafer S.

The chamber 1010 is made of a metal (e.g., aluminum), and has a substantially cylindrical shape. The chamber 1010 may provide a process region PR for processing the wafer S. The chamber 1010 may isolate the process region PR from the outside. Accordingly, process parameters (e.g., temperature, composition ratio, partial pressure, and/or pressure of the process region PR) may be precisely controlled.

The stage 1020 may support the wafer S. The wafer S is supported by a support member included in the stage. The stage 1020 may include a ceramic material (e.g., aluminum nitride (AlN)) or a metal material (e.g., aluminum or a nickel-based alloy). The stage 1020 may include a heater for temperature control of the wafer S. The heater may be built into a support plate of the stage 1020. The stage 1020 may move the wafer S up and down or rotate the wafer S.

A plurality of (e.g., three) support pins may be embedded in the stage 1020. The support pins may protrude from the upper surface of the stage 1020 (e.g., the surface supporting the wafer S) to separate (e.g., to lift) the wafer S from the stage 1020. Through the operation of these support pins, it is possible to easily pick up and put down the wafer (S).

The shower head 1030 may supply processing gases including the first to fifth gases G1, G2, G3, G4, and G5 into the chamber 1010 in the form of a shower. The shower head 1030 may include, for example, a metallic material. The shower head 1030 may face the stage 1020. The shower head 1030 may be fixed to the ceiling of the chamber 1010.

The shower head 1030 may provide a gas diffusion space GDR. Process gases may be sufficiently diffused in the gas diffusion space GDR before being provided to the process region PR. Accordingly, the shower head 1030 enables uniform supply of process gases to the process region PR. The process gases diffused in the gas diffusion space GDR may be transferred to the process region PR through a plurality of holes 1031 of the shower head 1030.

The exhaust portion 1040 exhausts gases from the process region PR. The exhaust portion 1040 may include an exhaust duct, an exhaust device, and an exhaust pipe. The exhaust device may include, for example, a vacuum pump, a pressure control valve, and the like. During processing, the gas in the chamber 1010 is exhausted through the exhaust pipe by the exhaust device of the exhaust portion 1040.

The processing gas supply device 1050 may be configured to supply the first to fifth gases G1, G2, G3, G4, and G5.

The processing gas supply device 1050 may include first to fourth buffer chambers 1051, 1052, 1053, and 1054, first to fourth valves 1055, 1056, 1057, and 1058, and a gas supply line 1059. The processing gas supply device 1050 may further include one or more mass flow controllers. The processing gas supply device 1050 may further include gas sources for supplying the first to fifth gases G1, G2, G3, G4, and G5.

The gas supply line 1059 may provide a flow path through which the first to fifth gases G1, G2, G3, G4, and G5 are delivered to the chamber 1010. The first to fourth buffer chambers 1051, 1052, 1053, and 1054 and the first to fourth valves 1055, 1056, 1057, and 1058 may be installed on the gas supply line 1059.

The first to fourth buffer chambers 1051, 1052, 1053, and 1054 may store the first to fourth gases G1, G2, G3, and G4 supplied to the chamber 1010, respectively. The first to fourth buffer chambers 1051, 1052, 1053, and 1054 may temporarily store the first to fourth gases G1, G2, G3, and G4, respectively. Accordingly, before the first to fourth gases G1, G2, G3, and G4 are supplied to the chamber 1010, pressures of the first to fourth gases G1, G2, G3, and G4 in the first to fourth buffer chambers 1051, 1052, 1053, and 1054 may be adjusted to a set value.

The first to fourth valves 1055, 1056, 1057, and 1058 may be between the first to fourth buffer chambers 1051, 1052, 1053, and 1054 and the chamber 1010, respectively. The first to fourth gases G1, G2, G3, and G4 stored in the first to fourth buffer chambers 1051, 1052, 1053, and 1054 may be supplied to the chamber 1010 through the first to fourth valves 1055, 1056, 1057, and 1058, respectively. The first to fourth valves 1055, 1056, 1057, and 1058 may allow or block delivery of the first to fourth gases G1, G2, G3, and G4 to the chamber 1010, respectively. Due to the operation of the first to fourth valves 1055, 1056, 1057, and 1058, the first to fourth gases G1, G2, G3, and G4 may be delivered to the chamber 1010 in a pulsing manner.

As a non-limiting example, the first to fourth valves 1055, 1056, 1057, and 1058 may be electronic automatic valves, and may be controlled by an external electronic signal. According to some example embodiments, the first to fourth valves 1055, 1056, 1057, and 1058 are valves for switching between supply and shutoff of gas when ALD is performed, and may be an ALD-based valve that may be opened and closed at a high speed. According to some example embodiments, the ALD-based valve may be opened and closed at a time interval of 0.5 seconds or less, for example, 0.01 seconds or less.

According to some example embodiments, the fifth gas G5 may be continuously supplied through the gas supply line 1059.

According to some example embodiments, the first gas G1 may include a hydrogen-containing compound. According to some example embodiments, the second gas G2 may include a hydrogen ($H_2$) gas. According to some example embodiments, the second gas G2 may be a hydrogen ($H_2$) gas. According to some example embodiments, the third gas G3 may include a precursor. According to some example embodiments, the fourth and fifth gases G4 and G5 may include an inert gas (e.g., nitrogen ($N_2$)).

Figure 2A:
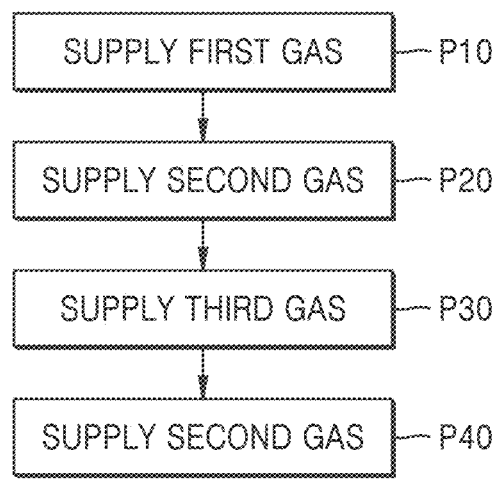
FIG. 2A is a flowchart illustrating a method of manufacturing a semiconductor device, according to an example embodiment.

FIG. 2A is a flowchart illustrating a method of manufacturing a semiconductor device, according to an example embodiment. In more detail, FIG. 2A shows one ALD cycle, and ALD may be repeatedly performed to achieve a target deposition thickness.

Figure 2B:
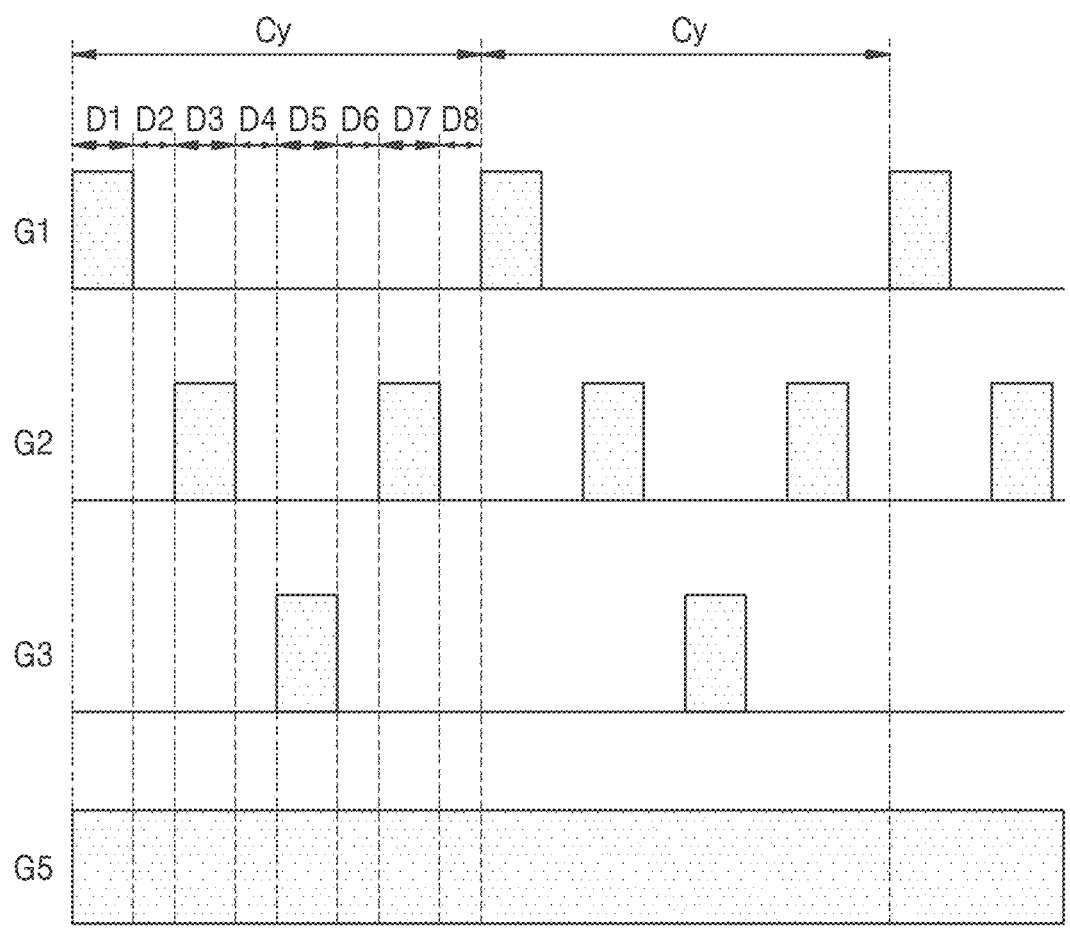
FIG. 2B is a graph for explaining a method of manufacturing a semiconductor device, according to an example embodiment.

FIG. 2B is a graph for explaining a method of manufacturing a semiconductor device, according to an example embodiment. FIG. 2B shows a plurality of ALD cycles Cy that come sequentially.

Referring to FIGS. 1 to 2B, in P10, the first gas G1 may be supplied to the chamber 1010. The first gas G1 may include a hydrogen-containing compound. One ALD cycle Cy may include first to eighth duties D1, D2, D3, D4, D5, D6, D7, and D8. According to some example embodiments, by performing P10, a hydrogen-containing compound may be deposited on the wafer S. In other words, P10 may be to supply the first gas G1 to the chamber 1010 so that the hydrogen-containing compound is deposited on the wafer S.

According to some example embodiments, P10 may correspond to the first duty D1 of the cycle Cy. That is, during the first duty D1, the first gas G1 may be supplied to the chamber 1010. The first gas G1 may be supplied to the chamber 1010 in a pulsing manner. The first gas G1 is supplied to the chamber 1010 during the first duty D1, but may not be supplied to the chamber 1010 during the second to eighth duties D2, D3, D4, D5, D6, D7, and D8.

During the first to eighth duties D1, D2, D3, D4, D5, D6, D7, and D8, the fifth gas G5 may be supplied as a continuous gas.

Subsequently, at the second duty D2, the first to fourth gases G1, G2, G3, and G4 may not be supplied. That is, during the second duty D2, only the fifth gas G5, which is a continuous gas, may be supplied to the chamber 1010. At the second duty D2, the partial pressure and density of the first gas G1 in the chamber 1010 may be sufficiently low. In some cases, the second duty D2 may be omitted, and the third duty D3 may come immediately after the first duty D1.

Subsequently, in P20, the second gas G2 may be supplied to the chamber 1010. The second gas G2 may include a hydrogen ($H_2$) gas. The second gas G2 may be hydrogen gas. According to some example embodiments, by performing P20, the residual first gas G1 in the chamber 1010 may be removed, and the surface of the wafer S, on which the hydrogen-containing compound is deposited, may be treated by hydrogen. In other words, P20 may be to supply the second gas G2 to the chamber 1010 so that the inside of the chamber 1010 is purged and the surface of the wafer S, on which the hydrogen-containing compound is deposited, is treated. According to some example embodiments, a hydrophilic treatment may be performed on the surface of the wafer S by supplying the second gas G2.

According to some example embodiments, P20 may correspond to the third duty D3 of the cycle Cy. That is, during the third duty D3, the second gas G2 may be supplied to the chamber 1010. The second gas G2 may be supplied to the chamber 1010 in a pulsing manner. The second gas G2 may be supplied to the chamber 1010 during the third duty D3, but may not be supplied to the chamber 1010 during the first, second, and fourth duties D1, D2, and D4.

Subsequently, at the fourth duty D4, the first to fourth gases G1, G2, G3, and G4 may not be supplied. That is, during the fourth duty D4, only the fifth gas G5, which is a continuous gas, may be supplied to the chamber 1010. At the fourth duty D4, the partial pressure and density of the second gas G2 in the chamber 1010 may be sufficiently low. In some cases, the fourth duty D4 may be omitted, and the fifth duty D5 may come immediately after the third duty D3.

Subsequently, in P30, the third gas G3 may be supplied to the chamber 1010. The third gas G3 may include a precursor. According to some example embodiments, by performing P30, the hydrogen-containing compound and the precursor on the surface of the wafer S may react with each other. In other words, P30 may be to supply the third gas G3 to the chamber 1010 so that the target material is formed on the surface of the wafer S.

According to some example embodiments, P30 may correspond to the fifth duty D5 of the cycle Cy. That is, during the fifth duty D5, the third gas G3 may be supplied to the chamber 1010. The third gas G3 may be supplied to the chamber 1010 in a pulsing manner. The third gas G3 may be supplied to the chamber 1010 during the fifth duty D5, but may not be supplied to the chamber 1010 during the first to fourth and sixth to eighth duties D1, D2, D3, D4, D6, D7, and D8.

Subsequently, at the sixth duty D6, the first to fourth gases G1, G2, G3, and G4 may not be supplied. That is, during the sixth duty D6, only the fifth gas G5, which is a continuous gas, may be supplied to the chamber 1010. At the sixth duty D6, the partial pressure and density of the second gas G2 in the chamber 1010 may be sufficiently low. In some cases, the sixth duty D6 may be omitted, and the seventh duty D7 may come immediately after the third duty D5.

Subsequently, in P40, the second gas G2 may be supplied to the chamber 1010. According to some example embodiments, by performing P40, the remaining third gas G3 in the chamber 1010 may be purged. In other words, P40 may be purging the chamber 1010 with the second gas G2.

According to some example embodiments, P40 may correspond to the seventh duty D7 of the cycle Cy. That is, during the seventh duty D7, the second gas G2 may be supplied to the chamber 1010. The second gas G2 may be supplied to the chamber 1010 in a pulsing manner. The second gas G2 may be supplied to the chamber 1010 during the seventh duty D7, but may not be supplied to the chamber 1010 during the fifth, sixth, and eighth duties D5, D6, and D8.

Subsequently, at the eighth duty D8, the first to fourth gases G1, G2, G3, and G4 may not be supplied. That is, during the eighth duty D8, only the fifth gas G5, which is a continuous gas, may be supplied to the chamber 1010. At the eighth duty D8, the partial pressure and density of the second gas G2 in the chamber 1010 may be sufficiently low. In some cases, the eighth duty D8 may be omitted, the ALD may be terminated or the first duty D1 of the next cycle Cy may arrive, after the seventh duty D7.

Similarly, each of the cycles Cy may include P10 to P40. Here, it has been described that P10, P20, P30, and P40 are performed in order, but the ALD method described above may be interpreted as that P20, P30, P40, and P10 are performed in sequence, P30, P40, P10, and P20 are performed in order, or P40, P10, P20, and P30 are performed in order.

According to some example embodiments, the length (or period) of the first duty D1 may be longer than the length of the second duty D2. According to some example embodiments, the length of the third duty D3 may be longer than the length of the fourth duty D4. According to some example embodiments, the length of the fifth duty D5 may be longer than the length of the sixth duty D6. According to some example embodiments, the length of the seventh duty D7 may be longer than the length of the eighth duty D8.

The first, third, fifth, and seventh duties D1, D3, D5, and D7 are sections in which gases other than nitrogen are supplied. The second, fourth, sixth, and eighth duties D2, D4, D6, and D8 are sections in which gases other than nitrogen (e.g., the remaining gases in the chamber 1010) are exhausted by continuous nitrogen gas supply. According to some example embodiments, by making at least any one of the first, third, fifth, and seventh duties D1, D3, D5, and D7 relatively longer than at least any one of the second, fourth, sixth and eighth duties D2, D4, D6, and D8, the deposition thickness of the film per cycle and the density of the deposited film may be increased.

Figure 3A:
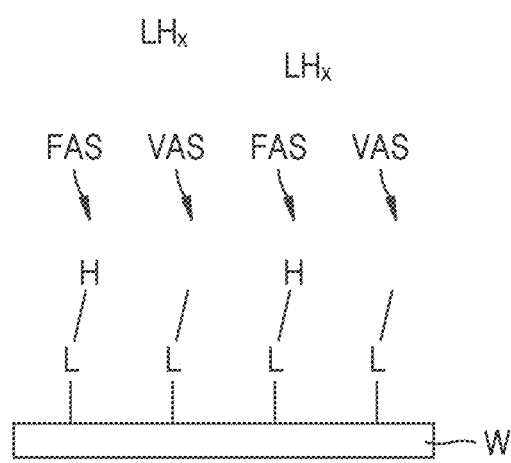
FIGS. 3A to 3C are diagrams for explaining the effects of a method of manufacturing a semiconductor device, according to an example embodiment.
Figure 3B:
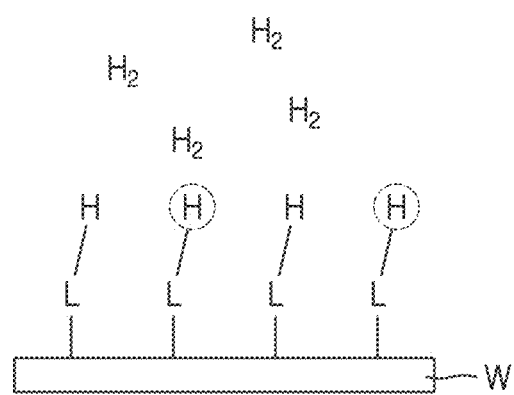
Figure 3C:
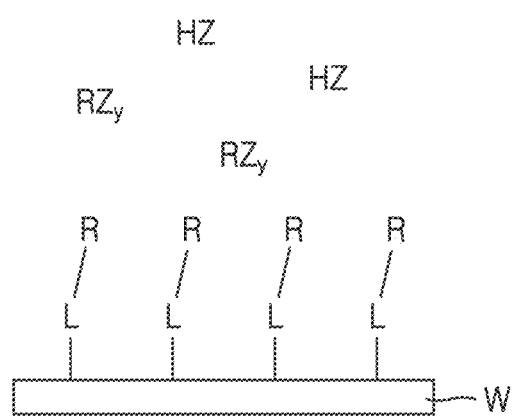

FIGS. 3A to 3C are diagrams for explaining the effects of a method of manufacturing a semiconductor device, according to an example embodiment.

Referring to FIG. 3A, a hydrogen-containing compound $LH_x$ may be deposited on the surface of the wafer S, through P10 (refer to FIG. 2A). Here, the subscript x is a positive integer. For example, the hydrogen-containing compound may be a compound containing hydrogen, such as $NH_3$. In this case, some of the hydrogen containing compounds may lose at least some of the hydrogen. Accordingly, full attachment sites (FAS) of the hydrogen-containing compound that do not lose hydrogen and vacant attachment sites (VAS) of the hydrogen-containing compound that have lost hydrogen on the surface of the wafer S, may be formed.

Next, referring to FIGS. 3A and 3B, VAS may be treated by the hydrogen treatment of P20 (refer to FIG. 2A) to become FAS. In FIG. 3B, treated VAS are indicated by dashed circles for convenience of understanding. By the hydrogen treatment, the number of FAS on the surface of the wafer S is increased. That is, the hydrogen treatment of P20 may hydrogenate the surface of the wafer S. For example, the hydrogen treatment of P20 may compensate for hydrogen loss in the VAS on the surface of the wafer S.

Accordingly, the reactivity of the subsequent precursor may be improved, the amount of reaction on the surface of the wafer S is increased in one ALD cycle (Cy, see FIG. 2b), and the density of the thin film formed by ALD may be improved.

Next, referring to FIGS. 3B and 3C, the precursor RZy may react with the hydrogen-containing compound deposited on the wafer S by P30 (refer to FIG. 2A), and thus a film including the target material RL may be formed on the wafer S. Here, HZ is a by-product of an ALD reaction. In some example embodiments, the hydrogen-containing compound may react with the metal precursor RZy to form a film including RL, and in this case, L may be oxygen or a carbon compound including oxygen. In some example embodiments, the hydrogen-containing compound may react with the metal precursor RZy to form a film including RL, which is metal nitride, and in this case, L may be nitrogen or a carbon compound including nitrogen.

In some example embodiments, the reduction of the precursor may occur by P30 to form a film including the target material R on the wafer S. In this case, the film including R may be a film composed of R, which is a single metal element.

As an example, the material to be deposited on the wafer S may be aluminum. According to some example embodiments, the first gas G1 may be $AlH_2(^tBuN)CH_2CH_2(NMe_2)$, and the third gas G3 may be $AlCl_3$.

Here, $^tBu$ is tertbutyl and 'Me' is methyl.

For example, the material to be deposited on the wafer S may be aluminum oxide ($Al_2O_3$). According to some example embodiments, the first gas G1 may be $H_2O$, and the third gas G3 may be $Al(O^iPr)_3$. According to some example embodiments, the first gas G1 may be $H_2O$ plasma, and the third gas G3 may be aluminum isopropoxide ($Al(O^iPr)_3$). According to some example embodiments, the first gas G1 may be $H_2O$, and the third gas G3 may be $Al(^iPrAMD)Et_2$. According to some example embodiments, the first gas G1 may be $H_2O$, and the third gas G3 may be $Al(mmp)_3$. According to some example embodiments, the first gas G1 may be $H_2O$, and the third gas G3 may be $Al(NEt_2)_3$. According to some example embodiments, the first gas G1 may be $H_2O$, and the third gas G3 may be $Al(N^iPr_2)_2(C_3H_6NMe_2)$. According to some example embodiments, the first gas G1 may be $H_2O$, and the third gas G3 may be $Al(N^iPr_2)_3$. According to some example embodiments, the first gas G1 may be $H_2O$, and the third gas G3 may be $Al(NMe_2)_3$. According to some example embodiments, the first gas G1 may be $H_2O$, and the third gas G3 may be $Al(O^nPr)_3$. According to some example embodiments, the first gas G1 may be $H_2O$, and the third gas G3 may be $Al(O^sBu)_3$. According to some example embodiments, the first gas G1 may be $H_2O$, and the third gas G3 may be $AlCl_3$. According to some example embodiments, the first gas G1 may be ROH, and the third gas G3 may be $AlCl_3$. According to some example embodiments, the first gas G1 may be $H_2O$, and the third gas G3 may be $AlEt_3$. According to some example embodiments, the first gas G1 may be $H_2O$, and the third gas G3 may be $AlMe_2O^iPr$. According to some example embodiments, the first gas G1 may be $H_2O$, and the third gas G3 may be $AlMe_3$. According to some example embodiments, the first gas G1 may be hydrogen peroxide ($H_2O_2$), and the third gas G3 may be $AlMe_3$. According to some example embodiments, the first gas G1 may be $^iPrOH$, and the third gas G3 may be $AlMe_3$. According to some example embodiments, the first gas G1 may include oxygen ($O_2$). $H_2O$, and hydrogen peroxide ($H_2O_2$), and the third gas G3 may be $AlMe_3$. According to some example embodiments, the first gas G1 may be $^nPrOH$, and the third gas G3 may be $AlMe_3$. According to some example embodiments, the first gas G1 may be ethanol (EtOH), and the third gas G3 may be $AlMe_3$. According to some example embodiments, the first gas G1 may be MeOH, and the third gas G3 may be $AlMe_3$.

Here, R is an alkyl group, $^iPr$ is iso-propyl, $^nPr$ is a linear isomer of iso-propyl. 'Et' is ethyl, 'mmp' is 1-methoxy-2-methyl-2-propoxy, and AMD is acetamidinate.

For example, the material to be deposited on the wafer S may be aluminum nitride (AlN). According to some example embodiments, the first gas G1 may be $N_2H_4 \cdot HCl$, and the third gas G3 may be $Al(NEt_2)_3$. According to some example embodiments, the first gas G1 may be $NH_3$, and the third gas G3 may be $Al(NEt_2)_3$. According to some example embodiments, the first gas G1 may be $N_2H_4$, and the third gas G3 may be $Al(NEt_2)$. According to some example embodiments, the first gas G1 may be NH, and the third gas G3 may be $Al(NMe_2)_3$. According to some example embodiments, the first gas G1 may be $NH_3$, and the third gas G3 may be $AlCl_3$. According to some example embodiments, the first gas G1 may be $NH_3$ plasma, and the third gas G3 may be $AlEt_3$. According to some example embodiments, the first gas G1 may be $NH_3$, and the third gas G3 may be $AlMe_3$. According to some example embodiments, the first gas G1 may be $NH_3$, and the third gas G3 may be $AlEt_3$. According to some example embodiments, the first gas G1 may be $NH_3$, and the third gas G3 may be $AlMe_3$. According to some example embodiments, the first gas G1 may be $NH_3$ plasma, and third gas G3 may be $AlMe_3$. According to some example embodiments, the first gas G1 may be $N_2H_4$, and the third gas G3 may be $AlMe_3$. According to some example embodiments, the first gas G1 may be methyl hydrazine ($MeHNNH_2$), and the third gas G3 may be $AlMe_3$. According to some example embodiments, the first gas G1 may be $NH_3$, and the third gas G3 may be $Me_2EtN:AlH_3$. According to some example embodiments, the first gas G1 may be $NH_3$, and the third gas G3 may be $Me_3N:AlH_3$.

As another example, the material to be deposited on the wafer S may be silicon (Si). According to some example embodiments, the first gas G1 may be $Si_2H_6$, and the third gas G3 may be $Si_2Cl_6$. According to some example embodiments, the first gas G1 may be $Si_2H_6$, and the third gas G3 may be $SiCl_4$.

As another example, the material to be deposited on the wafer may be silicon nitride, such as $Si_3N_4$. According to some example embodiments, the first gas G1 may be $NH_3$ plasma, and the third gas G3 may be $N(SiH_3)_3$. According to some example embodiments, the first gas G1 may be $NH_3$ plasma, and the third gas G3 may be $Si_2Cl_3H_3$. According to some example embodiments, the first gas G1 may be $NH_3$ plasma, and the third gas G3 may be $Si_2Cl_5H$. According to some example embodiments, the first gas G1 may be $N_2H_4$, and the third gas G3 may be $Si_2Cl_6$. According to some example embodiments, the first gas G1 may be $NH_3$, and the third gas G3 may be $Si_2Cl_6$. According to some example embodiments, the first gas G1 may be $NH_3$ plasma, and the third gas G3 may be $Si_2Cl_6$. According to some example embodiments, the first gas G1 may be $NH_3$, and the third gas G3 may be $Si_3Cl_8$. According to some example embodiments, the first gas G1 may be $NH_3$, and the third gas G3 may be $SiCl_2H_2$. According to some example embodiments, the first gas G1 may be $NH_3$ plasma, and the third gas G3 may be $SiCl_2H_2$. According to some example embodiments, the first gas G1 may be $NH_3$ plasma, and the third gas G3 may be $SiCl_2Me_2$. According to some example embodiments, the first gas G1 may be $NH_3$, and the third gas G3 may be $SiCl_4$. According to some example embodiments, the first gas G1 may be $NH_3$ plasma, and According to some example embodiments, the first gas G1 may be $NH_3$, and the third gas G3 may be $SiHMe_3$. According to some example embodiments, the first gas G1 may be $NH_3$, and the third gas G3 may be $SiI_4$.

As another example, the material to be deposited on the wafer may be SiC. According to some example embodiments, the first gas G1 may be $C_2H_2$, and the third gas G3 may be $Si_2H_6$. According to some example embodiments, the first gas G1 may be $C_2H_4$, and the third gas G3 may be $Si_2H_6$. According to some example embodiments, the first gas G1 may be $C_2H_4$, and the third gas G3 may be $SiCl_2H_2$.

As another example, the material to be deposited on the wafer may be silicon oxide, such as $SiO_2$. According to some example embodiments, the first gas G1 may be $H_2O_2$, and the third gas G3 may be $MeOSi(NCO)_3$. According to some example embodiments, the first gas G1 may be $H_2O$, and the third gas G3 may be $Si(NCO)_4$. According to some example embodiments, the first gas G1 may include $H_2O$ and $O_3$, and the third gas G3 may be $Si(OEt)_3((CH_2)_3NH_2)$. According to some example embodiments, the first gas G1 may be $H_2O$, and the third gas G3 may be $Si(OEt)_4$. According to some example embodiments, the first gas G1 may be $H_2O$, and the third gas G3 may be $Si(OMe)_4$. According to some example embodiments, the first gas G1 may be $H_2O$, and the third gas G3 may be $Si(OMe)_4$. According to some example embodiments, the first gas G1 may be $H_2O$, and the third gas G3 may be $SiCl_3H$. According to some example embodiments, the first gas G1 may be $H_2O$. and the third gas G3 may be $SiCl_4$. According to some example embodiments, the first gas G1 may be $NH_3$, and the third gas G3 may be $SiCl_4$. According to some example embodiments, the first gas G1 may be $H_2O_2$, and the third gas G3 may be $SiH(NMe_2)_3$. According to some example embodiments, the first gas G1 may be $H_2O$, and the third gas G3 may be $SiH(NMe_2)_3$.

As another example, the material to be deposited on the wafer may be titanium (Ti). According to some example embodiments, the first gas G1 may be CHD, and the third gas G3 may be $TiCl_4$. According to some example embodiments, the first gas G1 may be DHP, and the third gas G3 may be $TiCl_4$.

Here, 'CHD' is 1,4-bis(trimethylsilyl)-2-methyl-1,4-cyclohexadien, and 'DHP' is 1,4-bis(trimethylsilyl)-1,4-dihydropyrazine.

As another example, the material to be deposited on the wafer may be, for example, titanium nitride, such as TiN. According to some example embodiments, the first gas G1 may be $NH_3$, and the third gas G3 may be $Ti(NEt_2)_4$. According to some example embodiments, the first gas G1 may be $NH_3$, and the third gas G3 may be $Ti(NEtMe)_4$. According to some example embodiments, the first gas G1 may be $NH_3$ plasma, and the third gas G3 may be $Ti(NEt_2)_4$. According to some example embodiments, the first gas G1 may be $NH_3$, and the third gas G3 may be $Ti(NMe_2)_4$. According to some example embodiments, the first gas G1 may be $NH_3$ plasma, and the third gas G3 may be $Ti(NMe_2)_4$. According to some example embodiments, the first gas G1 may include $NH_3$ and $H_2$ plasma, and the third gas G3 may be $Ti(NMe_2)_4$. According to some example embodiments, the first gas G1 may be $N_2H_4$, and the third gas G3 may be $Ti(NMe_2)_4$. According to some example embodiments, the first gas G1 may be $NH_3$, and the third gas G3 may be $TiCl_4$. According to some example embodiments, the first gas G1 may be $Me_2NNH_2$, and the third gas G3 may be $TiCl_4$. According to some example embodiments, the first gas G1 may be $^tBuNH_2$, and the third gas G3 may be $TiCl_4$. According to some example embodiments, the first gas G1 may be $AyNH_2$, and the third gas G3 may be $TiCl_4$. According to some example embodiments, the first gas G1 may be $N_2H_4$, and the third gas G3 may be $TiCl_4$. According to some example embodiments, the first gas G1 may be $NH_3$, and the third gas G3 may be $TiI_4$. According to some example embodiments, the first gas G1 may be $^tBuNH_2$, and the third gas G3 may be $TiI_4$. According to some example embodiments, the first gas G1 may be $AyNH_2$, and the third gas G3 may be $TiI_4$.

Here, 'Ay' is Allyl.

As another example, the material to be deposited on the wafer may be, for example, titanium oxide, such as $TiO_2$. According to some example embodiments, the first gas G1 may be $H_2O$, and the third gas G3 may be $Ti(NEt_2)_4$. According to some example embodiments, the first gas G1 may be $H_2O$, and the third gas G3 may be $Ti(NEtMe)_3(guan-NEtMe)$. According to some example embodiments, the first gas G1 may be $H_2O$, and the third gas G3 may be $Ti(NMe_2)_3(guan-NMe_2)$. According to some example embodiments, the first gas G1 may be $H_2O$, and the third gas G3 may be $Ti(NMe_2)_4$. According to some example embodiments, the first gas G1 may be $H_2O_2$, and the third gas G3 may be $Ti(NMe_2)_4$. According to some example embodiments, the first gas G1 may be $H_2O$ plasma, and the third gas G3 may be $Ti(NMe_2)_4$. According to some example embodiments, the first gas G1 may be $H_2O$, and the third gas G3 may be $Ti(NMeEt)_4$. According to some example embodiments, the first gas G1 may be $H_2O$, and the third gas G3 may be $Ti(OEt)_4$. According to some example embodiments, the first gas G1 may be $H_2O_2$, and the third gas G3 may be $Ti(OEt)_4$. According to some example embodiments, the first gas G1 may be $H_2O$, and the third gas G3 may be $Ti(O^iPr)_2(dmae)_2$. According to some example embodiments, the first gas G1 may be $H_2O$, and the third gas G3 may be $Ti(O^iPr)_2(NMe_2)_2$. According to some example embodiments, the first gas G1 may be $H_2O$, and the third gas G3 may be $Ti(O^iPr)_2(tmhd)_2$. According to some example embodiments, the first gas G1 may be $H_2O$, and the third gas G3 may be $Ti(O^iPr)_3(^iPr_2AMD)$. According to some example embodiments, the first gas G1 may be $H_2O$, and the third gas G3 may be $Ti(O^iPr)_4$. According to some example embodiments, the first gas G1 may be $H_2O_2$, and the third gas G3 may be $Ti(O^iPr)_4$. According to some example embodiments, the first gas G1 may be $H_2O$ plasma, and the third gas G3 may be $Ti(O^iPr)_4$. According to some example embodiments, the first gas G1 may be HCOOH, and the third gas G3 may be $Ti(O^iPr)_4$. According to some example embodiments, the first gas G1 may be $CH_3COOH$, and the third gas G3 may be $Ti(O^iPr)_4$. According to some example embodiments, the first gas G1 may be $NH_3$, and the third gas G3 may be $Ti(O^iPr)_4$. According to some example embodiments, the first gas G1 may include $O_2$ and $NH_3$, and the third gas G3 may be $Ti(O^iPr)_4$. According to some example embodiments, the first gas G1 may be $H_2O$, and the third gas G3 may be $Ti(OMe)_4$. According to some example embodiments, the first gas G1 may be $H_2O$, and the third gas G3 may be $Ti(trhd)_2(O(CMe_2Et)_2$. According to some example embodiments, the first gas G1 may be $H_2O$, and the third gas G3 may be $TiCl_4$. According to some example embodiments, the first gas G1 may be $H_2O_2$, and the third gas G3 may be $TiCl_4$. According to some example embodiments, the first gas G1 may be MeOH, and the third gas G3 may be $TiCl_4$. According to some example embodiments, the first gas G1 may be $H_2O$ plasma, and the third gas G3 may be $TiCl_4$. According to some example embodiments, the first gas G1 may be $H_2O$, and the third gas G3 may be $TiF_4$. According to some example embodiments, the first gas G1 may be $H_2O_2$, and the third gas G3 may be $TiI_4$. According to some example embodiments, the first gas G1 may be $H_2O$, and the third gas G3 may be $TiI_4$.

Here, guan is guanidinate, dmae is dimethylaminoethoxide, and tmhd is tetramethylheptadionate.

As another example, the material to be deposited on the wafer may be, for example, niobium oxide, such as $Nb_2O_5$. According to some example embodiments, the first gas G1 may be $H_2O$, and the third gas G3 may be $Nb(N^tBu)(NEt_2)_3$. According to some example embodiments, the first gas G1 may be $H_2O$, and the third gas G3 may be $Nb(N^tBu)(NEtMe)_3$. According to some example embodiments, the first gas G1 may be $H_2O$ plasma, and the third gas G3 may be $Nb(N^tBu)(NEtMe)_3$. According to some example embodiments, the first gas G1 may be $H_2O$, and the third gas G3 may be $Nb(OEt)_3$.

As another example, the material to be deposited on the wafer may be niobium carbide ($NbC_x$). According to some example embodiments, the first gas G1 may be $AlMe_3$, and the third gas G3 may be $NbCl_5$. According to some example embodiments, the first gas G1 may be $AlMe_3$, and the third gas G3 may be $NbF_5$.

As another example, the material to be deposited on the wafer may be, for example, niobium carbide such as NbN. According to some example embodiments, the first gas G1 may be $NH_3$, and the third gas G3 may be $Ti(NEt_2)_4$. According to some example embodiments, the first gas G1 may be $H_2O$, and the third gas G3 may be $NbCl_5$.

As another example, the material to be deposited on the wafer may be Cu. According to some example embodiments, the first gas G1 may be $H_2O$, and the third gas G3 may be $Cu(NEt_2)_4$. According to some example embodiments, the first gas G1 may be $Cu(acac)_2 C_6H_4(OH)_2$, and the third gas G3 may be $Cu(acac)_2$. According to some example embodiments, the first gas G1 may be $SiH_2Et_2$, and the third gas G3 may be Cu(dki)L. According to some example embodiments, the first gas G1 may be $ZnEt_2$, and the third gas G3 may be $Cu(dmap)_2$. According to some example embodiments, the first gas G1 may include HCOOH and $H_2NNH_2$, and the third gas G3 may be $Cu(dmap)_2$. According to some example embodiments, the first gas G1 may be $BH_3(NHMe_2)$, and the third gas G3 may be $Cu(dmap)_2$. According to some example embodiments, the first gas G1 may be HCOOH, and the third gas G3 may be $Cu(dmap)_2BH_3(NHMe_2)$. According to some example embodiments, the first gas G1 may be $^tBuNHNH_2$, and the third gas G3 may be $Cu(dmap)_2$. According to some example embodiments, the first gas G1 may be ROH, and the third gas G3 may be $Cu(hfac)_2$. According to some example embodiments, the first gas G1 may be HCHO, and the third gas G3 may be $Cu(hfac)_2$. According to some example embodiments, the first gas G1 may be $ZnEt_2$, and the third gas G3 may be $Cu(hfac)_2$. According to some example embodiments, the first gas G1 may be $H_2O$, and the third gas G3 may be $Ti(NEt_2)_4$. According to some example embodiments, the first gas G1 may be $H_2O$, and the third gas G3 may be $Cu(hfac)_2$.

Here, acac is acetylacetone, dki is diketiminate, L is a neutral olefin ligand, dmap is dimethylamino-2-propoxide, and hfac is hexafluoroacetylacetonate.

As another example, the material to be deposited on the wafer may be zirconium nitride ($ZrN_x$). According to some example embodiments, the first gas G1 may be $NH_3$, and the third gas G3 may be $Zr(NEt_2)_4$. According to some example embodiments, the first gas G1 may be $NH_3$, and the third gas G3 may be $Zr(NEtMe)_4$. According to some example embodiments, the first gas G1 may be $NH_3$, and the third gas G3 may be $Zr(NMe_2)_4$.

As another example, the material to be deposited on the wafer may be zirconium oxide ($ZrO_2$). According to some example embodiments, the first gas G1 may be $H_2O$, and the third gas G3 may be $Zr(Cp)(^tBuDAD)(O^iPr)$. According to some example embodiments, the first gas G1 may be $H_2O$, and the third gas G3 may be $Zr(CpMe)_2Me(OMe)$.

According to some example embodiments, the first gas G1 may be $H_2O$, and the third gas G3 may be $Zr(CpMe_2)_2Me(O^tBu)$. According to some example embodiments, the first gas G1 may be $H_2O$, and the third gas G3 may be $Zr(dmae)_4$. According to some example embodiments, the first gas G1 may be $H_2O$, and the third gas G3 may be $Zr(Me_5Cp)(TEA)$. According to some example embodiments, the first gas G1 may be $H_2O$, and the third gas G3 may be $Zr(MeAMD)_4$. According to some example embodiments, the first gas G1 may be $H_2O$, and the third gas G3 may be $Zr(MeCpxTMEA)$. According to some example embodiments, the first gas G1 may be $H_2O$, and the third gas G3 may be $Zr(NEt_2)_4$. According to some example embodiments, the first gas G1 may be $H_2O$, and the third gas G3 may be $Zr(NEtMe)_2(guan\text{-}NEtMe)_2$. According to some example embodiments, the first gas G1 may be $H_2O$. and the third gas G3 may be $Zr(NEtMe)_3(guan\text{-}NEtMe)$. According to some example embodiments, the first gas G1 may be $H_2O$, and the third gas G3 may be $Zr(NEtMe)_4$. According to some example embodiments, the first gas G1 may be $H_2O$, and the third gas G3 may be $Zr(NMe_2)_4$. According to some example embodiments, the first gas G1 may be $H_2O$, and the third gas G3 may be $Zr(O^iPr)_2(dmae)_2$. According to some example embodiments, the first gas G1 may be $H_2O$, and the third gas G3 may be $Zr(O^iPr)_4$. According to some example embodiments, the first gas G1 may be $H_2O$, and the third gas G3 may be $Zr(O^tBu)_2(dmae)_2$. According to some example embodiments, the first gas G1 may be $H_2O$, and the third gas G3 may be $Zr(O^tBu)_4$. According to some example embodiments, the first gas G1 may be $H_2O$, and the third gas G3 may be $Zr[N(SiMe_3)_2]_2Cl_2$. According to some example embodiments, the first gas G1 may be $H_2O$, and the third gas G3 may be $ZrCl_4$. According to some example embodiments, the first gas G1 may be $H_2O$, and the third gas G3 may be $Ti(NEt_2)_4$. According to some example embodiments, the first gas G1 may be $H_2O$, and the third gas G3 may be $ZrCp_2Me_2$. According to some example embodiments, the first gas G1 may be $H_2O_2$, and the third gas G3 may be $ZrI_4$. According to some example embodiments, the first gas G1 may be $H_2O$, and the third gas G3 may be $ZrI_4$.

Here, tBuDAD is N,N-bis(tertbutyl)ethene-1,2-diaminato, Cp is η5-cyclopentadienyl, and TEA is triethanoolaminate.

As another example, the material to be deposited on the wafer may be molybdenum. According to some example embodiments, the first gas G1 may be $Si_2H_6$, and the third gas G3 may be $MoF_6$.

As another example, the material to be deposited on the wafer may be molybdenum nitride ($MoN_x$). According to some example embodiments, the first gas G1 may be $NH_3$, and the third gas G3 may be $MoO_2Cl_6$. According to some example embodiments, the first gas G1 may be $NH_3$, and the third gas G3 may be $Mo(CO)_6$. According to some example embodiments, the first gas G1 may be $NH_3$ plasma, and the third gas G3 may be $Mo(CO)_6$. According to some example embodiments, the first gas G1 may be $NH_3$, and the third gas G3 may be $Mo(N^tBu)_2(NEt_2)_2$. According to some example embodiments, the first gas G1 may be $NH_3$, and the third gas G3 may be $Mo(N^tBu)_2(NMe_2)_2$. According to some example embodiments, the first gas G1 may be $NH_3$, and the third gas G3 may be $MoCl_5$. According to some example embodiments, the first gas G1 may be $Me_2NNH_2$, and the third gas G3 may be $MoCl_5$.

As another example, the material to be deposited on the wafer may be molybdenum oxide ($MoO_3$). According to some example embodiments, the first gas G1 may be $H_2O$, and the third gas G3 may be $Mo(EtBen)_2$. According to some example embodiments, the first gas G1 may be $H_2O$, and the third gas G3 may be $Mo(NMe_2)_4$.

As another example, the material to be deposited on the wafer may be molybdenum oxide ($MoO_x$). According to some example embodiments, the first gas G1 may include $H_2O$ and $O_3$, and the third gas G3 may be $MoCl_4O$.

As another example, the material to be deposited on the wafer may be hafnium nitride ($HfN_x$). According to some example embodiments, the first gas G1 may be $NH_3$, and the third gas G3 may be $Hf(NEt_2)_4$. According to some example embodiments, the first gas G1 may be $NH_3$, and the third gas G3 may be $Hf(NEtMe)_4$. According to some example embodiments, the first gas G1 may be $NH_3$, and the third gas G3 may be $Hf(NMe_2)_4$.

As another example, the material to be deposited on the wafer may be hafnium oxide ($HfO_2$). According to some example embodiments, the first gas G1 may be $H_2O$, and the third gas G3 may be $[Hf\{\eta^2\text{-}(^iPrN)_2CNEtMe\}(NEtMe)_3]$. According to some example embodiments, the first gas G1 may be $H_2O$, and the third gas G3 may be $Hf(BH_4)_4$. According to some example embodiments, the first gas G1 may be $H_2O$, and the third gas G3 may be $Hf(Cp)(NMe_2)_3$. According to some example embodiments, the first gas G1 may be $H_2O$, and the third gas G3 may be $Hf(CpMe)_2(mmp)Me$. According to some example embodiments, the first gas G1 may be $H_2O$, and the third gas G3 may be $Hf(CpMe)_2(O^iPr)Me$. According to some example embodiments, the first gas G1 may be $H_2O$, and the third gas G3 may be $Hf(CpMe)_2(OMe)Me$. According to some example embodiments, the first gas G1 may be $H_2O$, and the third gas G3 may be $Hf(CpMe)_2Me_2$. According to some example embodiments, the first gas G1 may be $H_2O$, and the third gas G3 may be $Hf(mmp)_4$. According to some example embodiments, the first gas G1 may be $H_2O$, and the third gas G3 may be $Ti(NEt_2)_4$. According to some example embodiments, the first gas G1 may be $H_2O$, and the third gas G3 may be $Hf(mp)_4$. According to some example embodiments, the first gas G1 may be $H_2O$, and the third gas G3 may be $Hf(NEt_2)_4$. According to some example embodiments, the first gas G1 may be $H_2O$, and the third gas G3 may be $Hf(NMe_2)_2(guan\text{-}NMe_2)_2$. According to some example embodiments, the first gas G1 may be $H_2O$, and the third gas G3 may be $Hf(NMe_2)_4$. According to some example embodiments, the first gas G1 may be $H_2O$, and the third gas G3 may be $Hf(NO_3)_4$. According to some example embodiments, the first gas G1 may be $H_2O$, and the third gas G3 may be $Hf(ONEt_2)_4$. According to some example embodiments, the first gas G1 may be $H_2O$, and the third gas G3 may be $Hf(O^tBu)_2(mmp)_2$. According to some example embodiments, the first gas G1 may be HCOOH, and the third gas G3 may be Hf(O$^t$Bu)$_4$. According to some example embodiments, the first gas G1 may be CH$_3$COOH, and the third gas G3 may be Hf(O$^t$Bu)$_4$. According to some example embodiments, the first gas G1 may be H$_2$O, and the third gas G3 may be Hf(O$^t$Bu)$_4$. According to some example embodiments, the first gas G1 may be H$_2$O, and the third gas G3 may be Hf[N(SiMe$_3$)$_2$]$_2$Cl$_2$. According to some example embodiments, the first gas G1 may be H$_2$O, and the third gas G3 may be HfCl$_4$. According to some example embodiments, the first gas G1 may be Hf(mmp)$_4$, and the third gas G3 may be HfCl$_4$. According to some example embodiments, the first gas G1 may be H$_2$O, and the third gas G3 may be HfCp(edpa)$_3$. According to some example embodiments, the first gas G1 may be H$_2$O, and the third gas G3 may be HfCp$_2$Cl$_2$. According to some example embodiments, the first gas G1 may be H$_2$O, and the third gas G3 may be HfCp$_2$Me$_2$. According to some example embodiments, the first gas G1 may be H$_2$O, and the third gas G3 may be HfI$_4$. According to some example embodiments, the first gas G1 may be H$_2$O, and the third gas G3 may be HfI$_4$.

As another example, the material to be deposited on the wafer may be tantalum. According to some example embodiments, the first gas G1 may be Si$_2$H$_6$, and the third gas G3 may be TaF$_5$.

As another example, the material to be deposited on the wafer may be tantalum oxide, such as Ta$_2$O$_5$. According to some example embodiments, the first gas G1 may be H$_2$O, and the third gas G3 may be Ta(NEt)(NEt$_2$)$_3$. According to some example embodiments, the first gas G1 may be H$_2$O, and the third gas G3 may be Ta(NEt$_2$)$_5$. According to some example embodiments, the first gas G1 may be H$_2$O, and the third gas G3 may be Ta(NMe$_2$)$_5$. According to some example embodiments, the first gas G1 may be H$_2$O, and the third gas G3 may be Ta(N$^t$Bu)($^i$PrAMD)$_2$(NMe$_2$). According to some example embodiments, the first gas G1 may be H$_2$O, and the third gas G3 may be Ta(N$^t$Bu)(NEt$_2$)$_3$. According to some example embodiments, the first gas G1 may be H$_2$O, and the third gas G3 may be Ta(OEt)$_5$. According to some example embodiments, the first gas G1 may be H$_2$O, and the third gas G3 may be TaCl$_5$. According to some example embodiments, the first gas G1 may be Ta(OEt)$_5$, and the third gas G3 may be TaCl$_5$. According to some example embodiments, the first gas G1 may be H$_2$O, and the third gas G3 may be TaF$_5$. According to some example embodiments, the first gas G1 may be H$_2$O$_2$, and the third gas G3 may be TaI$_5$.

As another example, the material to be deposited on the wafer may be tantalum nitride (TaN$_x$). According to some example embodiments, the first gas G1 may be NH$_3$, and the third gas G3 may be Ta(NEtMe)$_5$. According to some example embodiments, the first gas G1 may be NH$_3$, and the third gas G3 may be Ta(NMe$_2$)$_5$. According to some example embodiments, the first gas G1 may be NH$_3$ plasma, and the third gas G3 may be Ta(NMe$_2$)$_5$. According to some example embodiments, the first gas G1 may be NH$_3$, and the third gas G3 may be Ta(N$^t$Bu)(NEt$_2$)$_3$. According to some example embodiments, the first gas G1 may be N$_2$H$_4$, and the third gas G3 may be Ta(N$^t$Bu)(NEt$_2$)$_3$. According to some example embodiments, the first gas G1 may be $^t$BuNH$_2$, and the third gas G3 may be TaBr$_5$. According to some example embodiments, the first gas G1 may be NH$_3$, and the third gas G3 may be TaCl$_5$. According to some example embodiments, the first gas G1 may be Me$_2$NNH$_2$, and the third gas G3 may be TaCl$_5$. According to some example embodiments, the first gas G1 may be $^t$BuNH$_2$, and the third gas G3 may be TaCl$_5$. According to some example embodiments, the first gas G1 may be AyNH$_2$, and the third gas G3 may be TaCl$_5$. According to some example embodiments, the first gas G1 may include NH$_3$ and AlMe$_3$, and the third gas G3 may be TaCl$_5$·SEt$_2$. According to some example embodiments, the first gas G1 may be NH$_3$, and the third gas G3 may be Ti(NEt$_2$)$_4$. According to some example embodiments, the first gas G1 may include H$_2$ plasma and NH$_3$, and the third gas G3 may be TaF$_5$. According to some example embodiments, the first gas G1 may include H$_2$ plasma and NH plasma, and the third gas G3 may be TaF$_5$.

As another example, the material to be deposited on the wafer may be tungsten (W). According to some example embodiments, the first gas G1 may be Si$_2$H$_6$, and the third gas G3 may be WF$_6$. According to some example embodiments, the first gas G1 may be B$_2$H$_6$, and the third gas G3 may be WF$_6$. According to some example embodiments, the first gas G1 may be B$_2$H$_6$, and the third gas G3 may be WF$_6$.

As another example, the material to be deposited on the wafer may be tungsten carbide (WCx). According to some example embodiments, the first gas G1 may be $^t$BuNHNH$_2$, and the third gas G3 may be W(CO)($_3$-hexyne)$_3$. According to some example embodiments, the first gas G1 may be $^t$BuNHNH$_2$, and the third gas G3 may be W(CO)($_3$-hexyne)$_3$. According to some example embodiments, the first gas G1 may be AlMe$_3$, and the third gas G3 may be WCl$_6$. According to some example embodiments, the first gas G1 may be AlH$_2$($^t$BuNCH$_2$CH$_2$NMe$_2$), and the third gas G3 may be WCl$_6$.

As another example, the material to be deposited on the wafer may be tungsten nitride (WN$_x$). According to some example embodiments, the first gas G1 may be NH$_3$ plasma, and the third gas G3 may be W(CO)($_3$-hexyne)$_3$. According to some example embodiments, the first gas G1 may be NH$_3$, and the third gas G3 may be W(CO)$_6$. According to some example embodiments, the first gas G1 may be NH$_3$, and the third gas G3 may be W(N$^t$Bu)$_2$(NMe$_2$)$_2$. According to some example embodiments, the first gas G1 may be NH$_3$ plasma, and the third gas G3 may be W(N$^t$Bu)$_2$(NMe$_2$)$_2$. According to some example embodiments, the first gas G1 may be NH$_3$, and the third gas G3 may be W$_2$(NMe$_2$)$_6$. According to some example embodiments, the first gas G1 may be NH$_3$, and the third gas G3 may be WCl$_5$. According to some example embodiments, the first gas G1 may be NH$_3$, and the third gas G3 may be WCl$_6$. According to some example embodiments, the first gas G1 may be NH$_3$, and the third gas G3 may be WF$_6$. According to some example embodiments, the first gas G1 may be NH$_3$ plasma, and the third gas G3 may be WF$_6$.

As another example, the material to be deposited on the wafer may be tungsten oxide (WO$_3$).

According to some example embodiments, the first gas G1 may be H$_2$O$_2$, and the third gas G3 may be W(CO)$_6$. According to some example embodiments, the first gas G1 may be H$_2$O. and the third gas G3 may be W(CO)$_6$. According to some example embodiments, the first gas G1 may be H$_2$O, and the third gas G3 may be W(N$^t$Bu)$_2$(NMe$_2$)$_2$. According to some example embodiments, the first gas G1 may be H$_2$O plasma, and the third gas G3 may be WF$_6$. According to some example embodiments, the first gas G1 may be H$_2$O, and the third gas G3 may be WO$_2$($^t$BuAMD)$_2$.

As another example, the material to be deposited on the wafer may be tungsten oxide (WO$_x$).

According to some example embodiments, the first gas G1 may be H$_2$O, and the third gas G3 may be W(N$^t$Bu)$_2$(NMe$_2$)$_2$. According to some example embodiments, the first gas G1 may be H$_2$O, and the third gas G3 may be W$_2$(NMe$_2$)$_6$. According to some example embodiments, the first gas G1 may be H₂O, and the third gas G3 may be WF₆. According to some example embodiments, the first gas G1 may be H₂O, and the third gas G3 may be $WF_xO_y$.

Figure 4A:
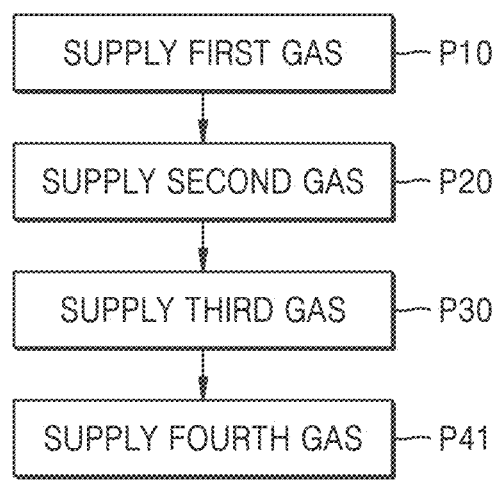
FIGS. 4A and 4B are diagrams for explaining a method of manufacturing a semiconductor device, according to an example embodiment.
Figure 4B:
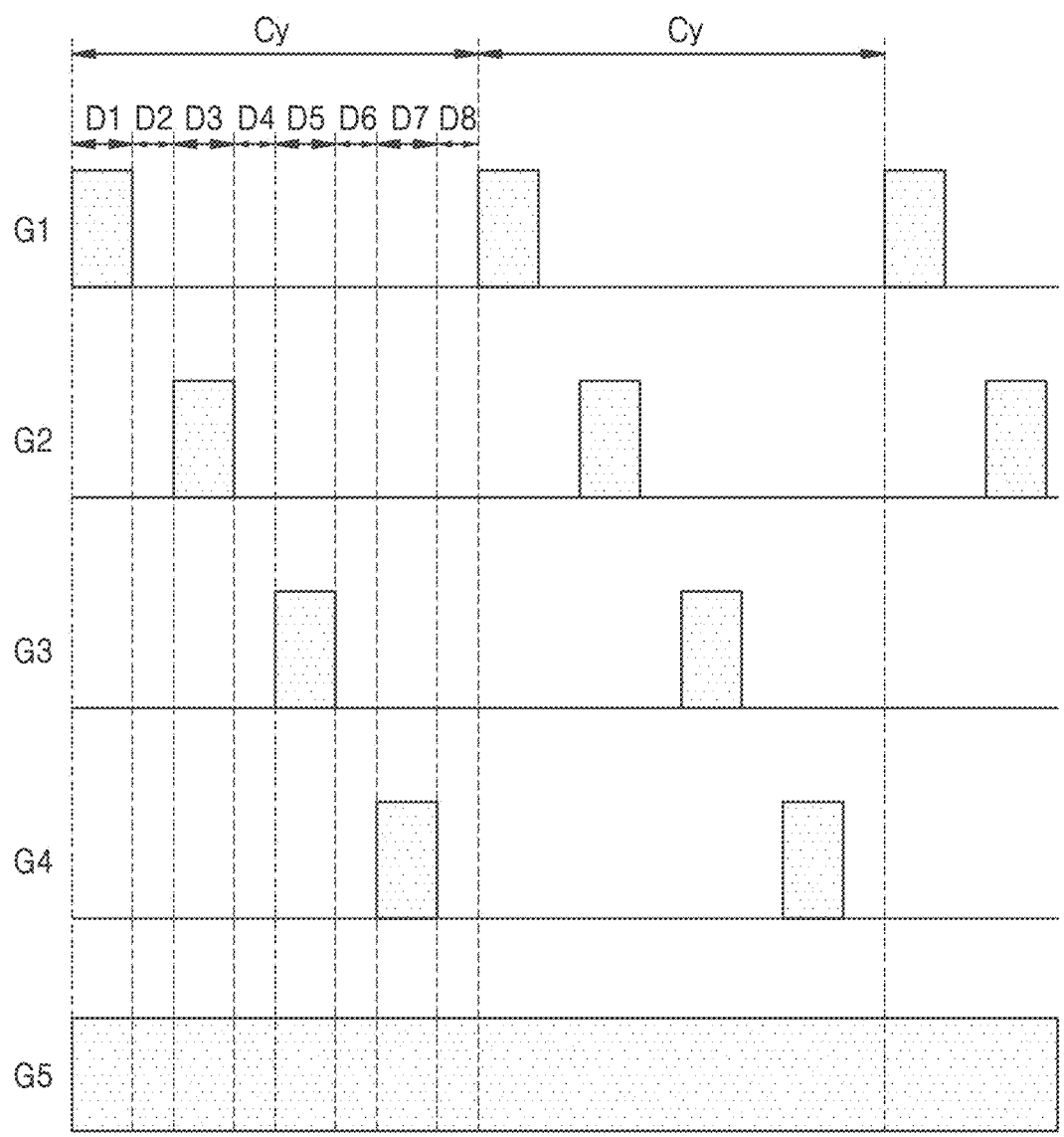

FIGS. 4A and 4B are diagrams for explaining a method of manufacturing a semiconductor device, according to an example embodiment.

Because P10, P20, and P30 of FIG. 4A are substantially the same as those described with reference to FIGS. 2A and 2B, descriptions already given for these are omitted.

Similarly, in FIG. 4B, except for the seventh duty D7, it is substantially the same as that described with reference to FIGS. 2A and 2B, and thus descriptions already given therefor are omitted.

Referring to FIGS. 1, 4A and 4B, in P41, the fourth gas G4 may be supplied to the chamber 1010. According to some example embodiments, by performing P41, the remaining third gas G3 in the chamber 1010 may be removed. In other words, P41 may be purging the chamber 1010 by supplying the fourth gas G4.

According to some example embodiments, P41 may correspond to the seventh duty D7 of the cycle Cy. That is, during the seventh duty D7, the fourth gas G4 may be supplied to the chamber 1010. That is, during the seventh duty D7, the second gas G2 may not be supplied to the chamber 1010. In some example embodiments, the second gas G2 may be supplied to the chamber 1010 during the seventh duty D7, but may not be supplied to the chamber 1010 during the first to sixth and eighth duties D1, D2, D3, D4, D5, D6, and D8.

Figure 5:
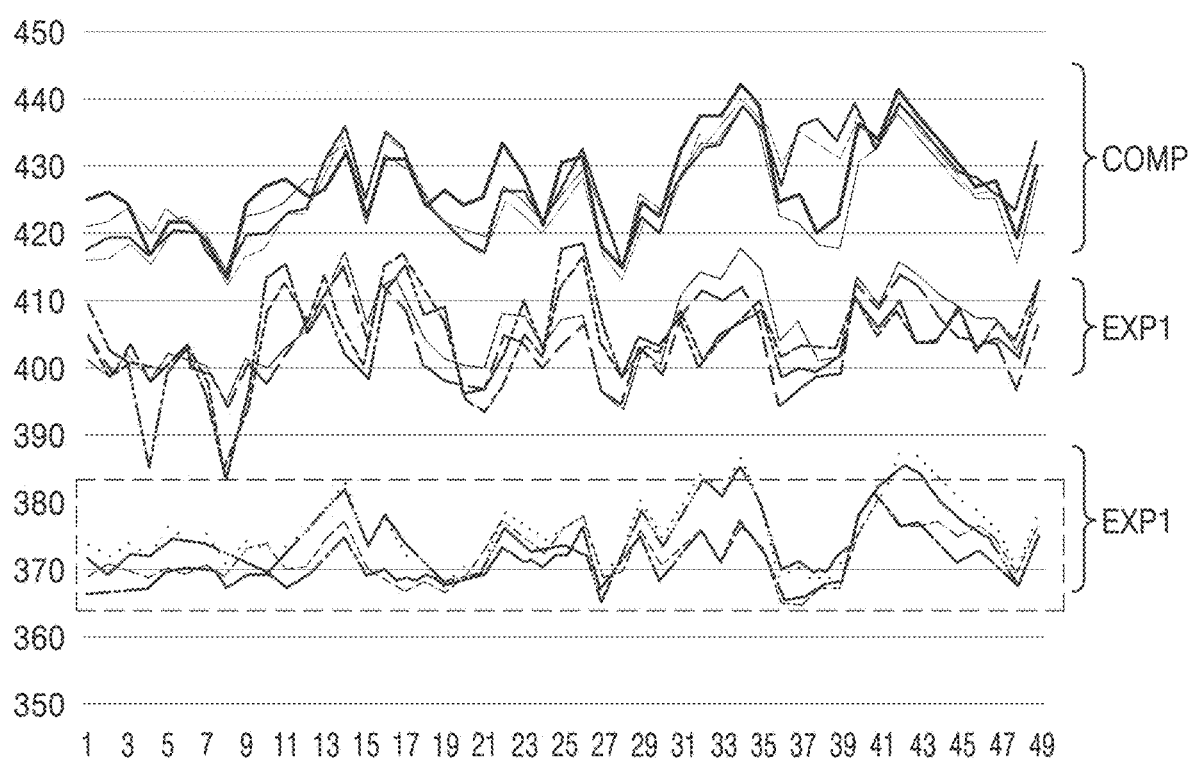
FIG. 5 is a graph for explaining an effect of a method of manufacturing a semiconductor device, according to an example embodiment.

FIG. 5 is a graph for explaining an effect of a method of manufacturing a semiconductor device, according to an example embodiment. In more detail, FIG. 5 shows sheet resistances of titanium nitride films formed based on comparative examples COMP, first experimental examples EXP1, and second experimental examples EXP2. In FIG. 5, a number on the horizontal axis is an ordinal number indicating measurement sites on a wafer.

Referring to FIGS. 1 and 5, in the comparative examples COMP, the first experimental examples EXP1, and the second experimental examples EXP2, the first gas G1, which is a hydrogen-containing compound, is NH₃, and the third gas G3, which is a precursor, is TiCl₄. In the comparative examples COMP, the first experimental examples EXP1, and the second experimental examples EXP2, the thickness of a titanium nitride film may be about 50 Å.

In the first experimental examples EXP1, the titanium nitride layer may be formed by any one of the methods described with reference to FIGS. 2A and 2B and the methods described with reference to FIGS. 4A and 4B.

The second experimental examples EXP2 are similar to the first experimental examples EXP1, but a ratio of the third duty D3 (refer to FIG. 2B) to the fourth duty D4 is relatively increased. For example, in the first experimental examples EXP1, the lengths of the third and fourth duties D3 and D4 are substantially equal to each other, whereas, in the second experimental examples EXP2, the length of the third duty D3 is greater than the length of the fourth duty D4. Thus, in the second experimental examples EXP2, after the hydrogen-containing compound is deposited on the surface of the wafer S, the amount of exposure to hydrogen H₂ is relatively increased compared to that of the first experimental examples EXP1.

In the comparative examples COMP, after providing NH₃ on the surface of the wafer S, nitrogen (N₂) gas is used for purging into the chamber 1010. That is, in the comparative examples COMP, after NH₃ is introduced into the chamber 1010, and before TiCl₄ is introduced into the chamber 1010, hydrogen (H₂) gas may not be provided. After providing TiCl₄, for purging, either hydrogen (H₂) gas or nitrogen gas (N₂) may be used.

Recently, as patterns for forming semiconductor devices have been miniaturized, there is a problem in that the ratio of barrier metal (e.g., TiN) with high resistance increases, thereby causing RC delay and power loss. Semiconductor device manufacturing methods according to some example embodiments use a conventional purging step to treat a hydrogen-containing compound with hydrogen gas and thus have the same turnaround time as in the prior art. In addition, such methods of manufacturing a semiconductor device have an advantage in that it does not require a large amount of capital expenditure because the method may utilize existing facilities.

TABLE 1

| Cyclic H₂ or N₂ Treatment | | Cl Intensity | Density | Resistivity |
|---|---|---|---|---|
| Before TiCl₄ | Before NH₃ | (10³) | (g/cm³) | (μΩ · cm) |
| N₂ | N₂ | 1.75 | 4.502 | 557.3 |
| N₂ | H₂ | 1.83 | 4.609 | 563.7 |
| H₂ | N₂ | 1.87 | 4.626 | 466.1 |
| H₂ | H₂ | 1.89 | 4.704 | 462.1 |

Referring to table 1, after depositing a hydrogen-containing compound (e.g., NH₃) on the wafer S and before providing a precursor (e.g., TiCl₄), by supplying H₂ instead of N₂ to the wafer S, the density of the formed film (e.g., the TiN film) and the intensity of Cl contained in the film increase, and the resistivity thereof decreases.

In addition, after depositing the precursor (e.g., TiCl₄) on the wafer S and before providing the hydrogen-containing compound (e.g., NH₃), by supplying H₂ instead of N₂ to the wafer S, the density of the formed film (e.g., the TiN film) and the intensity of Cl contained in the film increase, and the resistivity thereof decreases.

For example, when the surface of the wafer S is treated with hydrogen before deposition of a precursor (e.g., TiCl₄) and a hydrogen-containing compound (e.g., NH₃), respectively, the resistivity of the TiN film to be formed may be reduced by about 17.1%, compared to the case of treating the surface of the wafer S with nitrogen before deposition of a precursor (e.g., TiCl₄) and deposition of a hydrogen-containing compound (e.g., NH₃), respectively.

Figure 6:
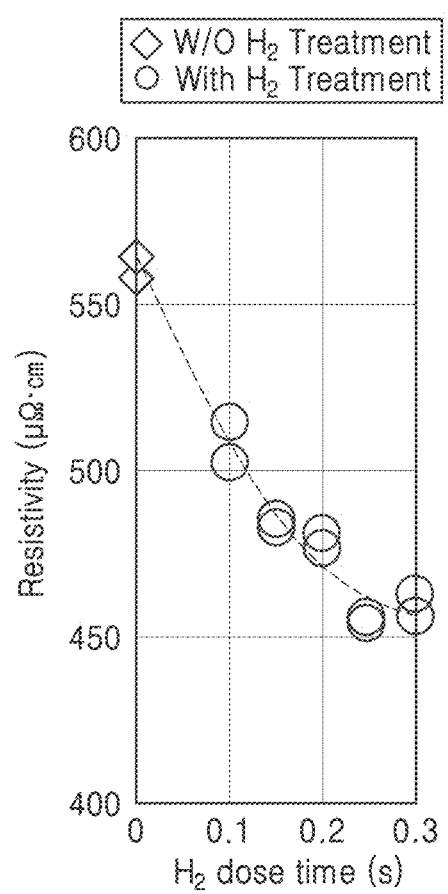
FIG. 6 illustrates a resistivity of a TiN film depending on a dose time of a second gas after provision of the first gas in a method of manufacturing a semiconductor device, according to an example embodiment.

FIG. 6 illustrates a resistivity of a TiN film depending on a dose time of a second gas G2 (refer to FIG. 1) after provision of the first gas G1 (refer to FIG. 1) in a method of manufacturing a semiconductor device, according to an example embodiment.

Referring to FIG. 6, it was confirmed that the resistivity of the TiN film decreases as the dose time of the second gas (G2, see FIG. 1) increases and the resistivity value of the TiN film is saturated when the dose time exceeds a desired (or alternatively, predetermined) value. In FIG. 6, a data point with a dose time of 0 means that the H₂ treatment is not performed in the process for forming TiN. A data point with a dose time of zero is indicated by a diamond in FIG. 6. Data of which dose time is not 0 is indicated by a dot in FIG. 6.

Referring to FIGS. 1, 2B, and 6, the dose time of the second gas G2 may be the length of the third duty D3. That is, by making the dose time of the second gas G2 sufficiently long, the resistivity of TiN may be improved. However, when the dose time is too long, the processing time increases and the amount of material used to manufacture the semiconductor device increases.

According to some example embodiments, the dose time of the second gas G2 may be in a range of about 0.01 seconds to about 5 seconds. According to some example embodiments, the dose time of the second gas G2 may be about 0.05 seconds or more. According to some example embodiments, the dose time of the second gas G2 may be about 0.1 seconds or more. According to some example embodiments, the dose time of the second gas G2 may be about 0.15 seconds or more. According to some example embodiments, the dose time of the second gas G2 may be about 0.2 seconds or more. According to some example embodiments, the dose time of the second gas G2 may be about 4.5 seconds or less. According to some example embodiments, the dose time of the second gas G2 may be about 4 seconds or less. According to some example embodiments, the dose time of the second gas G2 may be about 3.5 seconds or less. According to some example embodiments, the dose time of the second gas G2 may be about 3 seconds or less. According to some example embodiments, the dose time of the second gas G2 may be about 2.5 seconds or less. According to some example embodiments, the dose time of the second gas G2 may be about 2 seconds or less. According to some example embodiments, the dose time of the second gas G2 may be about 1.5 seconds or less. According to some example embodiments, the dose time of the second gas G2 may be about 1 second or less.

Figure 7:
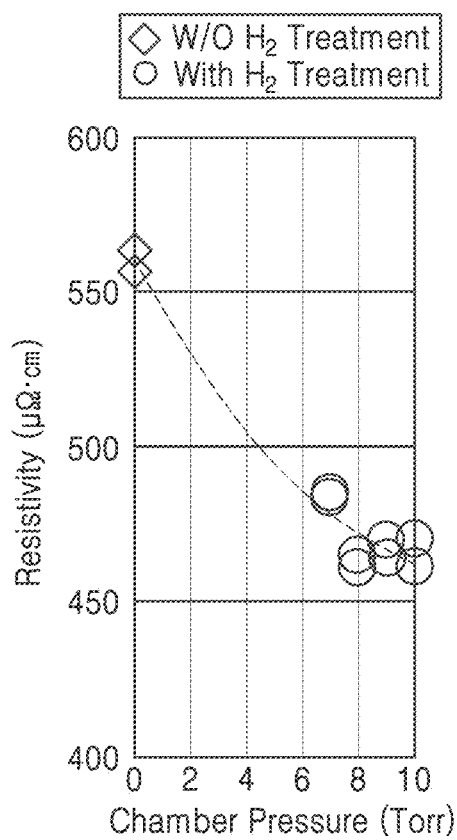
FIG. 7 illustrates a resistivity of a TiN film depending on pressure in a chamber during a second gas after provision of a first gas in a method of manufacturing a semiconductor device, according to an example embodiment.

FIG. 7 illustrates a resistivity of the TiN film depending on the pressure of the chamber 1010 (refer to FIG. 1) in a section in which the second gas G2 (refer to FIG. 1) is provided after the first gas G1 (refer to FIG. 1) is provided, (e.g., the third duty D3 of FIG. 2B), in a method of manufacturing a semiconductor device, according to an example embodiment.

Referring to FIG. 7, it was confirmed that the resistivity of the TiN film decreases as the pressure of the second gas (G2, see FIG. 1) increases, and the resistivity value of the TiN film was saturated when the pressure was higher than a desired (or alternatively, predetermined) value. In FIG. 7, a data point of zero pressure means that no $H_2$ treatment is performed in the process to form TiN. The data point where the pressure is zero is indicated by a diamond in FIG. 7. Data where the pressure is not zero is indicated by a dot in FIG. 7.

Referring to FIGS. 1, 2B, and 7, by increasing the pressure of the chamber 1010 sufficiently, the resistivity of TiN may be improved, but when the pressure becomes too large, the amount of material used to manufacture the semiconductor device increases.

According to some example embodiments, the pressure in the chamber 1010 may range from about 0.1 Torr to about 50 Torr. The pressure of the chamber 1010 may be about 0.5 Torr or more. The pressure of the second gas G2 may be about 1 Torr or more. The pressure of the second gas G2 may be about 1.5 Torr or more. According to some example embodiments, the pressure in the chamber 1010 may be about 2 Torr or more. According to some example embodiments, the pressure in the chamber 1010 may be about 3 Torr or more. According to some example embodiments, the pressure in the chamber 1010 may be about 4 Torr or more. According to some example embodiments, the pressure in the chamber 1010 may be about 5 Torr or more. According to some example embodiments, the pressure in the chamber 1010 may be about 6 Torr or more. According to some example embodiments, the pressure in the chamber 1010 may be about 7 Torr or more. According to some example embodiments, the pressure in the chamber 1010 may be about 8 Torr or more. According to some example embodiments, the pressure in the chamber 1010 may be about 9 Torr or more. According to some example embodiments, the pressure in the chamber 1010 may be about 10 Torr or more. According to some example embodiments, the pressure in the chamber 1010 may be about 50 Torr or less. According to some example embodiments, the pressure in the chamber 1010 may be about 2 Torr or less. According to some example embodiments, the pressure in the chamber 1010 may be about 40 Torr or less. According to some example embodiments, the pressure in the chamber 1010 may be about 35 Torr or less. According to some example embodiments, the pressure in the chamber 1010 may be about 30 Torr or less. According to some example embodiments, the pressure in the chamber 1010 may be about 25 Torr or less. According to some example embodiments, the pressure in the chamber 1010 may be about 20 Torr or less.

While the inventive concepts have been particularly shown and described with reference to some example embodiments thereof, it will be understood that various changes in form and details may be made therein without departing from the spirit and scope of the following claims.

What is claimed is:

1. A method of depositing an atomic layer of a metal-containing film, the method comprising:
    a plurality of deposition cycles, each of the plurality of deposition cycles including,
        adsorbing a hydrogen (H)-containing compound on a wafer surface in a chamber,
        treating a wafer on which the hydrogen-containing compound is adsorbed with hydrogen ($H_2$) gas, and
        providing a metal precursor to the wafer to react with the hydrogen-containing compound to form the metal-containing film.

2. The method of claim 1, wherein a dose time of the hydrogen gas is in a range of 0.01 seconds to 5 seconds.

3. The method of claim 1, wherein, in the treating of the wafer with the hydrogen gas, a pressure in the chamber is in a range of 0.1 Torr to 50 Torr.

4. The method of claim 1, wherein
    the hydrogen-containing compound is $NH_3$, and the metal precursor is $TiCl_4$,
    the hydrogen-containing compound is $NH_3$, and the metal precursor is $Ti(NEt_2)_4$,
    the hydrogen-containing compound is $NH_3$, and the metal precursor is $Ti(NEtMe)_4$,
    the hydrogen-containing compound is $NH_3$ plasma, and the metal precursor is $Ti(NEtMe)_4$,
    the hydrogen-containing compound is $NH_3$, and the metal precursor is $Ti(NMe_2)_4$,
    the hydrogen-containing compound is $N_2H_4$, and the metal precursor is $Ti(NMe_2)_4$,
    the hydrogen-containing compound is $Me_2NNH_2$, and the metal precursor is $TiCl_4$,
    the hydrogen-containing compound is $^tBuNH_2$, and the metal precursor is $TiCl_4$,
    the hydrogen-containing compound is allylNH$_2$, and the metal precursor is $TiCl_4$,
    the hydrogen-containing compound is $N_2H_4$, the metal precursor is $TiCl_4$,
    the hydrogen-containing compound is $NH_3$, and the metal precursor is $TiI_4$,
    the hydrogen-containing compound is $^tBuNH_2$, and the metal precursor is $TiI_4$, or
    the hydrogen-containing compound is allylNH$_2$, and the metal precursor is $TiI_4$.

5. The method of claim 1, wherein
the hydrogen-containing compound is $NH_3$ plasma, and the metal precursor is $W(CO)(3\text{-hexyne})_3$,
the hydrogen-containing compound is $NH_3$, and the metal precursor is $W(CO)(3\text{-hexyne})_3$,
the hydrogen-containing compound is $NH_3$ plasma, and the metal precursor is $W(CO)_6$,
the hydrogen-containing compound is $NH_3$, and the metal precursor is $W(CO)_6$,
the hydrogen-containing compound is $NH_3$, and the metal precursor is $W(N^tBu)_2(NMe_2)_2$,
the hydrogen-containing compound is $NH_3$ plasma, and the metal precursor is $W(N^tBu)_2(NMe_2)_2$,
the hydrogen-containing compound is $NH_3$, and the metal precursor is $W_2(NMe_2)_6$,
the hydrogen-containing compound is $NH_3$, and the metal precursor is $WCl_5$,
the hydrogen-containing compound is $NH_3$, and the metal precursor is $WCl_6$,
the hydrogen-containing compound is $NH_3$, and the metal precursor is $WF_6$, or
the hydrogen-containing compound is $NH_3$ plasma, and the metal precursor is $WF_6$.

6. The method of claim 1, wherein
the hydrogen-containing compound is $Si_2H_6$, and the metal precursor is $WF_6$,
the hydrogen-containing compound is $SiH_4$, and the metal precursor is $WF_6$, or
the hydrogen-containing compound is $B_2H_6$ plasma, and the metal precursor is $WF_6$.

7. The method of claim 1, wherein
the hydrogen-containing compound is $NH_3$, and the metal precursor is $MoO_2Cl_6$,
the hydrogen-containing compound is $NH_3$, and the metal precursor is $Mo(CO)_6$,
the hydrogen-containing compound is $NH_3$ plasma, and the metal precursor is $Mo(CO)_6$,
the hydrogen-containing compound is $NH_3$, and the metal precursor is $Mo(N^tBu)_2(NEt_2)_2$,
the hydrogen-containing compound is $NH_3$, and the metal precursor is $Mo(N^tBu)_2(NMe_2)_2$,
the hydrogen-containing compound is $NH_3$, and the metal precursor is $MoCl_5$, or
the hydrogen-containing compound is $Me_2NNH_2$, and the metal precursor is $MoCl_5$.

8. The method of claim 1, wherein each of the plurality of deposition cycles further comprises purging the chamber with hydrogen ($H_2$) gas to treat the wafer surface on which the metal precursor is provided.

9. The method of claim 1, wherein each of the plurality of deposition cycles further comprises purging the chamber with nitrogen ($N_2$) gas treat the wafer surface on which the metal precursor is provided.

10. The method of claim 1, wherein each of the plurality of deposition cycles further comprises
evacuating the hydrogen gas from the chamber after providing the hydrogen gas,
wherein a dose time of the hydrogen gas is greater than a period of the evacuating of the hydrogen gas.

11. A method of manufacturing a semiconductor device, the method comprising:
performing a plurality of deposition cycles to form a metal-containing film or a silicon-containing film, each of the plurality of deposition cycles including,
supplying a first gas including a hydrogen-containing compound to a chamber in which a wafer is loaded,
supplying a second gas to the chamber, and
supplying a third gas including a precursor including metal or silicon to the chamber,
wherein the precursor reacts with the hydrogen-containing compound to form the metal-containing or silicon-containing film, and
the second gas hydrogenates the hydrogen-containing compound.

12. The method of claim 11, wherein the second gas is hydrogen gas.

13. The method of claim 11, wherein the first to third gases are provided in a pulsing manner.

14. The method of claim 11, wherein each of the plurality of deposition cycles further comprises purging the chamber with the second gas.

15. The method of claim 11, wherein each of the plurality of deposition cycles further comprises purging the chamber with nitrogen ($N_2$).

16. The method of claim 11, wherein the hydrogen-containing compound is any one of $H_2O$, $NH_3$, $N_2H_4$, $Me_2NNH_2$, $^tBuNH_2$, $AyNH_2$, $N_2H_4$, $NH_3$, $^tBuNH_2$, $AyNH_2$, $Si_2H_6$, $SiH_4$, and $B_2H_6$.

17. The method of claim 11, wherein the precursor includes any one of Al, Si, Ti, Cu, Zr, Mo, Hf, Ta, and W.

18. The method of claim 11, wherein
the metal-containing film includes at least one of aluminum, aluminum oxide, aluminum nitride, titanium, titanium nitride, copper, zirconium oxide, molybdenum, molybdenum nitride, molybdenum oxide, hafnium oxide, tantalum, tantalum nitride, tungsten, tungsten oxide, tungsten nitride, niobium oxide, niobium carbide, and niobium nitride, and
the silicon-containing film includes at least one of silicon, silicon nitride, and silicon carbide.

19. A method of depositing an atomic layer, the method comprising:
depositing a hydrogen-containing compound on a surface of a wafer;
treating the hydrogen-containing compound with hydrogen gas; and
reacting the hydrogen-containing compound treated by the hydrogen gas with a precursor including titanium to form a film on the surface of the wafer.

20. The method of claim 19, wherein the hydrogen-containing compound is $NH_3$, and the precursor is $TiCl_4$,
the hydrogen-containing compound is $NH_3$, and the precursor is $Ti(NEt_2)_4$,
the hydrogen-containing compound is $NH_3$, and the precursor is $Ti(NEtMe)_4$,
the hydrogen-containing compound is $NH_3$ plasma, and the precursor is $Ti(NEtMe)_4$,
the hydrogen-containing compound is $NH_3$, and the precursor is $Ti(NMe_2)_4$,
the hydrogen-containing compound is $N_2H_4$, and the precursor is $Ti(NMe_2)_4$,
the hydrogen-containing compound is $Me_2NNH_2$, and the precursor is $TiCl_4$,
the hydrogen-containing compound is $^tBuNH_2$, and the precursor is $TiCl_4$,
the hydrogen-containing compound is $allylNH_2$, and the precursor is $TiCl_4$,
the hydrogen-containing compound is $N_2H_4$, and the precursor is $TiCl_4$,
the hydrogen-containing compound is $NH_3$, and the precursor is $TiCl_4$, the hydrogen-containing compound is $^t$BuNH$_2$, and the precursor is TiCl$_4$, or the hydrogen-containing compound is allylNH$_2$, and the precursor is TiCl$_4$.

\* \* \* \* \*